United States Patent [19]
Han

[11] Patent Number: 5,976,311
[45] Date of Patent: Nov. 2, 1999

[54] SEMICONDUCTOR WAFER WET PROCESSING DEVICE

[75] Inventor: Suk-Bin Han, Chungcheongbuk-do, Rep. of Korea

[73] Assignee: LG Semicon Co., Ltd., Chungcheongbuk-do, Rep. of Korea

[21] Appl. No.: 08/824,187

[22] Filed: Mar. 26, 1997

[30]       Foreign Application Priority Data

Jul. 18, 1996  [KR]   Rep. of Korea ...................... 96-28893

[51] Int. Cl.$^6$ .................................................. B08B 11/00
[52] U.S. Cl. .......................................... 156/345; 134/182
[58] Field of Search ............................ 156/345; 134/182, 134/902

[56]                References Cited
                   PUBLICATIONS

24th Symposium on ULSI Ultra Clean Technology pp. 93–95; Authors: Y. Hiratsuka, N. Fujikawa.

*Primary Examiner*—Bruce Breneman
*Assistant Examiner*—Rudy Zervignon

[57]                 ABSTRACT

A semiconductor wafer wet processing device which includes a chamber, a process tank body containing walls and disposed within the chamber, and defining a channel therebetween, at least one of the walls of the process tank body containing a plurality of apertures for providing lateral access between the channel and the interior of the process tank body, a wafer-carrying device disposed within the process tank body, an inlet for introducing a processing liquid into the channel and an outlet for removing the processing liquid from the interior of the process tank body, wherein upon the introduction of the processing liquid through the inlet into the channel, the processing liquid flows over the top of the walls of the process tank body into the interior thereof and laterally through the apertures in the walls of the process tank body for treating the contents thereof and is removed through the outlet.

20 Claims, 6 Drawing Sheets

SEMICONDUCTOR WAFER WET PROCESSING DEVICE

BACKGROUND OF THE INVENTION

1. Field of the Invention

The present invention relates to a semiconductor wafer wet processing device used in wet processes such as the cleaning of a semiconductor wafer during the fabrication of a semiconductor device.

2. Discussion of Related Art

The fabricating process of a semiconductor device includes various kinds of wafer wet processes. Particularly, a semiconductor wafer cleaning technique is of importance in a semiconductor device fabricating process. Accordingly, there has been developed an apparatus for a wafer wet process including wafer cleaning. Also, there is the overflow method of U.S. Pat. No. 5,293,373 applied to a conventional semiconductor wafer wet processing device which performs the wet process cleaning of a semiconductor wafer while a semiconductor wafer is inserted in a processing tank body. In the overflow method, the process solution, such as cleaning water, overflows onto the floor.

FIG. 1 is a cross-sectional view of a conventional wafer wet process device utilizing the overflow method.

The conventional wafer wet process device utilizing the overflow method comprises a container A provided with a supply line 12 containing a supply hole 11-2, a processing tank body 11 which contains a process solution which overflows over a wall 11-1, and a wafer carrying bucket 13 such as a boat or a cassette disposed in the processing tank body 11. The supply hole is formed at the bottom of the processing tank body. A plurality of wafers 10 are erectly arranged in the wafer carrying bucket 13, and a wafer contact 13-1 such as an inserting groove is formed on the lower side of the wafer carrying bucket 13 for mounting the wafer, as shown in the enlarged view of FIG. 1 (a). Since the wafer carrying bucket 13 has holes through its bottom and top, a cleaning water or a chemical solution such as a process solution introduced into the processing tank body 11 cleans the wafers and can perform chemical reactions such as etching, by passing a chemical solution between the wafers.

The process solution overflowing the wall of the processing tank body 11-1 through conduit 15 is recycled after the process solution is filtered by a filter 16. A pump 17 is used for supplying the processing solution, for instance, for circulating the process solution. A problem is caused when a conventional apparatus employs the overflow method in which the process solution flows up and down. Thus, the contaminant materials always remain on the wafer contact 13-1 formed on the lower side of the wafer carrying bucket 13, that is, the inserting groove for fixing the wafers. These contaminant materials move up and down according to the flow of the process solution, and as a result, there is the problem that the contaminant materials come into frequent contact with the surface of wafer 10.

For solving these problems, a conventional semiconductor wafer wet processing device utilizes a down-flowing method in which a process solution flows downward (see 24th Symposium On ULSI ULTRA Clean Technology, Japan)

FIG. 2 is a cross-sectional view of a conventional semiconductor wafer wet processing device which utilizes the down-flowing method. As shown in FIG. 2, a conventional semiconductor wafer wet processing device which utilizes a down-flow method comprises a container A which houses a processing tank body wall 21-1, a conduit 25 which surrounds the wall 21-1, and an exhaust hole 21-3 formed at the bottom of the body 21 through which the solution is exhausted. The process solution enters the processing tank body from the conduit 25 and flows up and down. This conventional device using a down-flow method has considerably improved the contaminant problem since the wafer contact 23-1 of the wafer carrying bucket 23 is positioned at or near the hole 21-3 of the processing tank body and thus the contaminant materials come into less contact with the wafer 20.

However, in the above-described conventional devices of the overflow and down-flow methods as shown in FIGS. 1 and 2, respectively, there is the disadvantage that they are insufficient in achieving an effective processing effect for the side and corner of the wafer. Because the process solution flows only in a uniform direction in these two methods, the cleaning and wet processing effect is reduced for that portion of the side or corner of the wafer which is not directly under the influence of the flow.

SUMMARY OF THE INVENTION

Accordingly, the present invention is directed to a semiconductor wafer wet processing device in which a wafer wet processing effect, such as removing contaminant materials, is improved by providing vertical and lateral flow of the process solution which substantially obviates one or more of the problems of conventional art.

Accordingly, an object of the present invention is to provide a semiconductor wafer wet processing device which improves the wafer wet processing effect of removing contaminant material by providing vertical and lateral flow of the process solution.

Other objects and further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

To achieve these and other advantages and in accordance with the purpose of the present invention, as embodied and broadly described, there is provided a semiconductor wafer wet processing device which uses the flow of a process solution by supplying it to a processing tank body which contains a wafer-carrying bucket having a plurality of wafers disposed therein. Exhaust holes are formed in the tank bottom for exhausting the solution supplied to the exhaust holes. The processing tank body comprises thereinside an upper process solution supplier for supplying the process solution from above the wafers disposed in the tank body, and a lateral process solution supplier for supplying the process solution laterally to the inserted wafers.

The lateral process solution supplier comprises a space formed between a double wall formed on both sides of the wafer and facing the periphery of the inserted wafers. Supply holes are formed on the body wall for supplying the process solution into this space and a plurality of distribution holes are formed on the inner wall of said double walls.

It is to be understood that both the foregoing general description and the following detailed description are exemplary and explanatory and are intended to provide further explanation of the present invention.

BRIEF DESCRIPTION OF THE ATTACHED DRAWINGS

The present invention will become more fully understood from the detailed description given hereinbelow and the accompanying drawings which are given by way of illustration only, and thus, are not limitative of the present invention, and wherein:

FIG. 1 and 1(a) are a is a cross-sectional view and an enlarged view of a conventional wafer wet process device using the overflowing method;

DETAILED DESCRIPTION OF PREFERRED EMBODIMENTS

Reference will now be made in detail to the preferred embodiments of the present invention, examples of which are illustrated in the accompanying drawings.

Hereinafter, the semiconductor wafer wet processing device of the present invention will be explained with reference to the drawings attached hereto.

Figure 1:
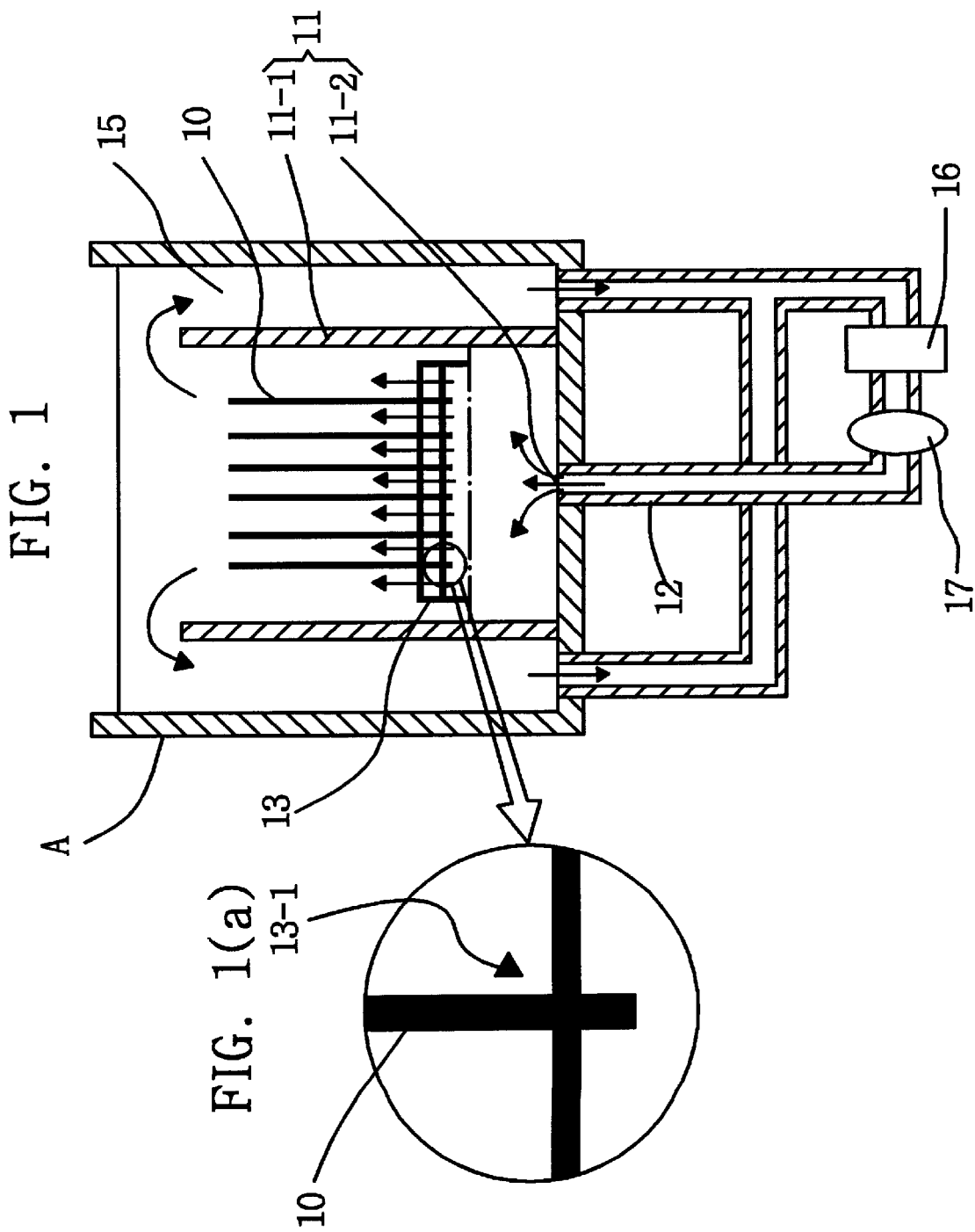
Figure 2:
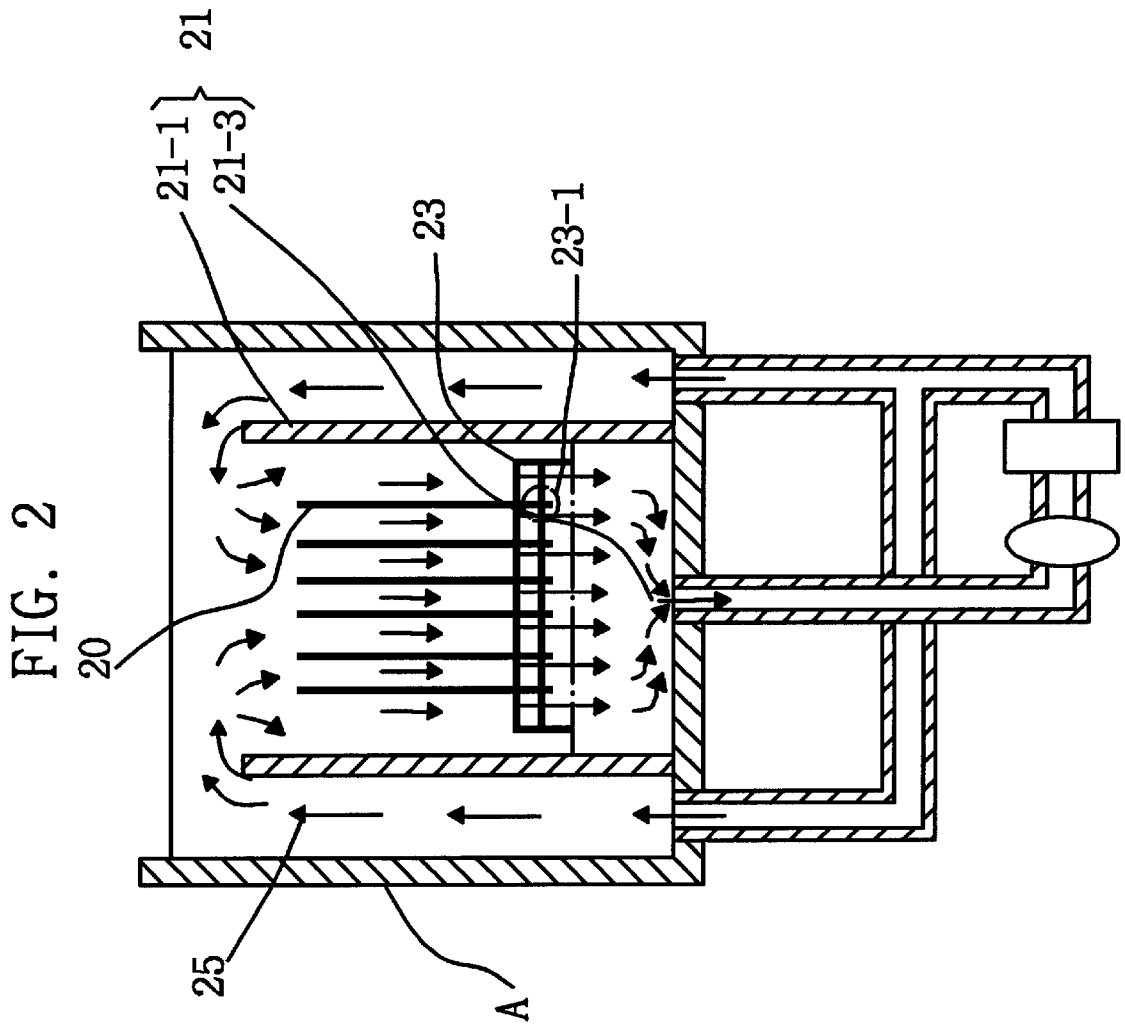
FIG. 2 is a cross-sectional view of a conventional semiconductor wafer wet processing device using the down-flow method.
Figure 3:
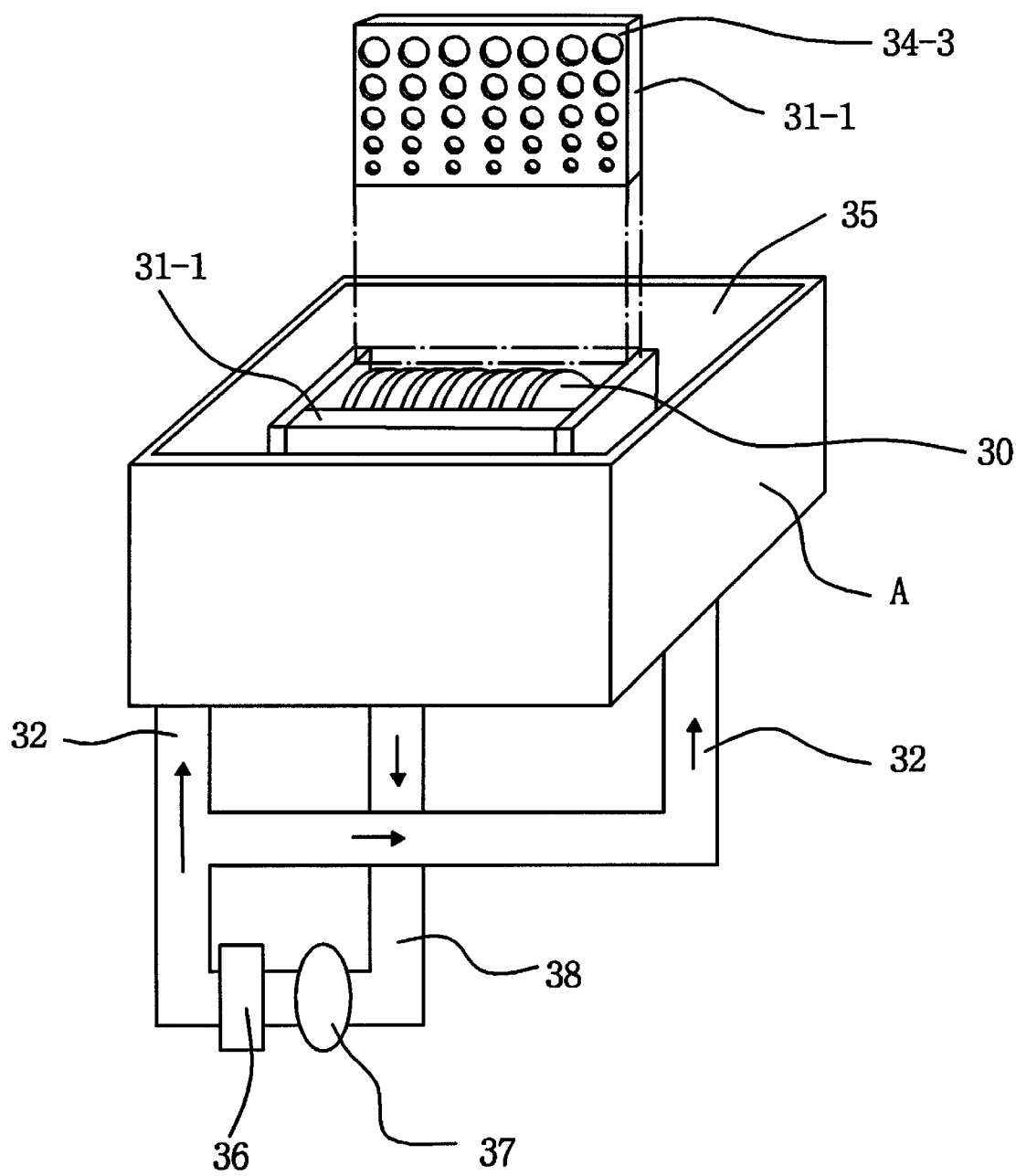
FIG. 3 is a schematic perspective view of a preferred embodiment of the semiconductor wafer wet processing device according to the present invention.
Figure 4:
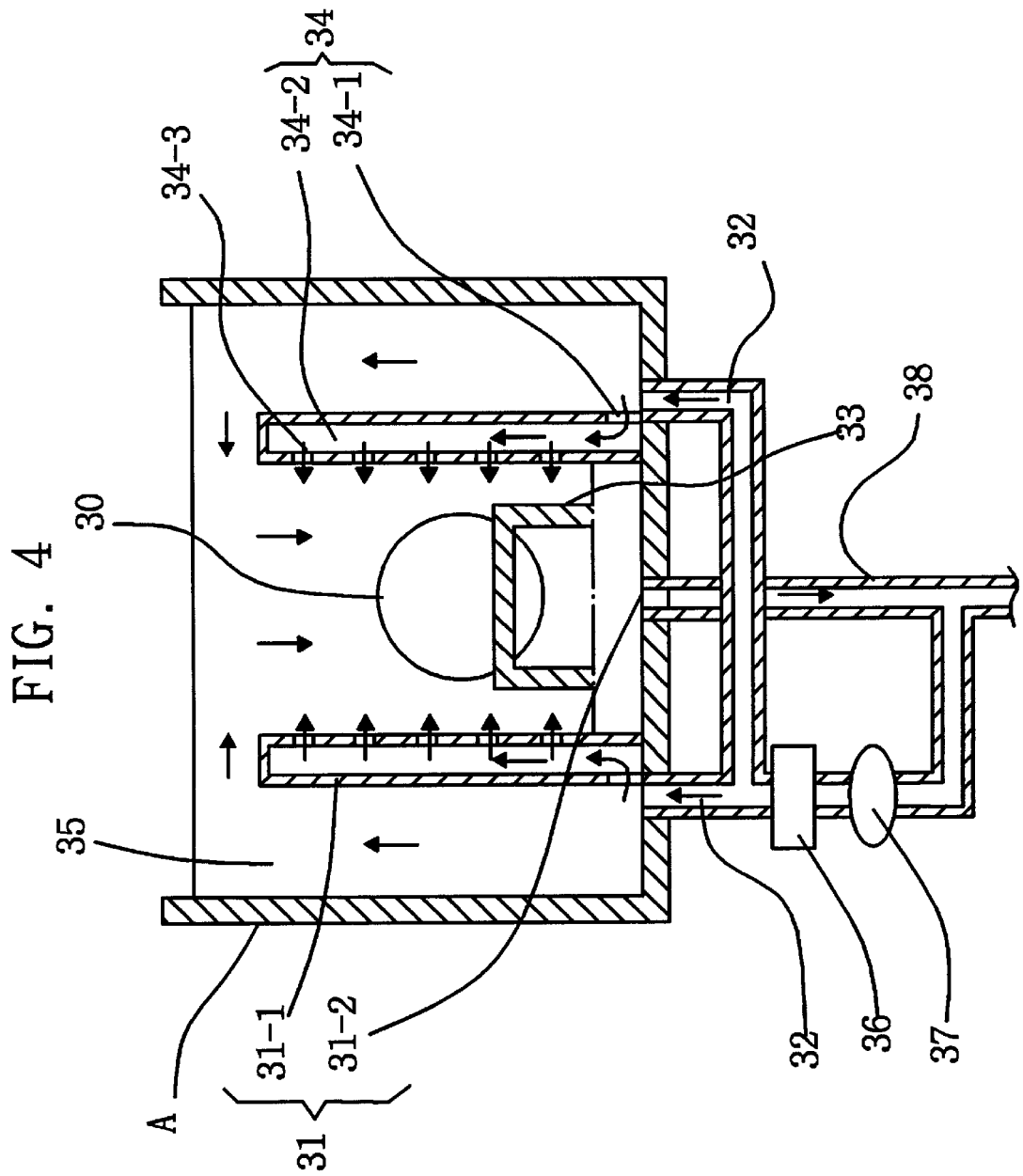
FIG. 4 is a schematic sectional view of the embodiment of FIG. 3 of the semiconductor wafer wet processing device of the present invention.

FIGS. 3 and 4 show the preferred embodiments of the semiconductor wafer wet processing device according to the present invention. In FIGS. 3 and 4, the same components are identified with the same reference numerals.

The semiconductor wafer wet processing device of the present invention as shown in FIGS. 3 and 4 comprises a wafer-carrying bucket 33, e.g. a wafer boat or cassette, in which a plurality of wafers 30 are fixed. The wafer-carrying bucket is disposed within a processing tank body 31 which contains an exhaust hole 31-2. The processing tank body 31 is in turn, disposed within a container A. A supply line or conduit 32 formed around the processing tank body wall 31-1 is provided for introducing the processing solution into the process solution supplier 35, which distributes the process solution to the top of the wafers as well as laterally through the inner wall of the lateral process solution supplier 34.

The lateral process solution supplier 34 comprises a space 34-2 formed between a double wall which defines the processing tank body wall 31-1. A supply hole 34-1 of the lateral process solution supplier formed in the body wall provides access of the process solution into the space. A plurality of distribution holes 34-3 are formed on the inner wall of said double walled solution supplier for laterally introducing the process solution at the periphery of the wafer, including the side of the wafer, whereby both sides of the wafer corresponding to the side of the wafer 30, fixed in the wafer-carrying bucket 33, can be treated.

The space 34-2 formed between the processing tank body walls 31-1 is formed only on the walls corresponding to the side of the wafer. Also, the processing tank body wall 31-1 having the space 34-2 and the distribution holes is detachable and removable so that the processing tank body wall can be exchanged with a wall having distribution holes of various sizes. Thus, the amount of the lateral supply of the process solution, the flow velocity and the strength thereof can be effectively controlled.

The size, number, and position of the distribution holes 34-3 are determined so as to provide the necessary quantity of the process solution, including the flow velocity and strength thereof, to compensate for the down-flow velocity of the process solution, including the strength and the degree thereof. The peripheral portion of the distribution holes is made of a material resistant to wear and friction.

The exhausting hole 31-2 is connected to an exhaust line 38 for exhausting the process solution being discharged from the processing tank body 31. The process solution can be recycled by a pump 37 and filtered by a filter 36 whereby it can be reintroduced into the system through the supply line 32.

In operation of the semiconductor wafer wet processing device of the present invention, the process solution, such as cleaning water or a chemical solution, is introduced into a channel 35 defined by the overflow body wall 31-1 and the outside wall of the device. The process solution is then supplied through the supply line 32 and channel 35 and over the overflow body wall 31-1 to the upper portion of the wafers disposed in the processing tank body 31. At the same time, the process solution is also supplied to the sides of the wafers 30 through the distribution holes 34-3 after the space 34-2 has been filled by transferring the process solution through the supply hole 34-1 of the lateral process solution supplier. Thus, since the process solution flows both downward and laterally through the wafers, the cleaning and wet processing is performed over the entire wafer 30 which is positioned within the flow of the processing solution.

Figure 5:
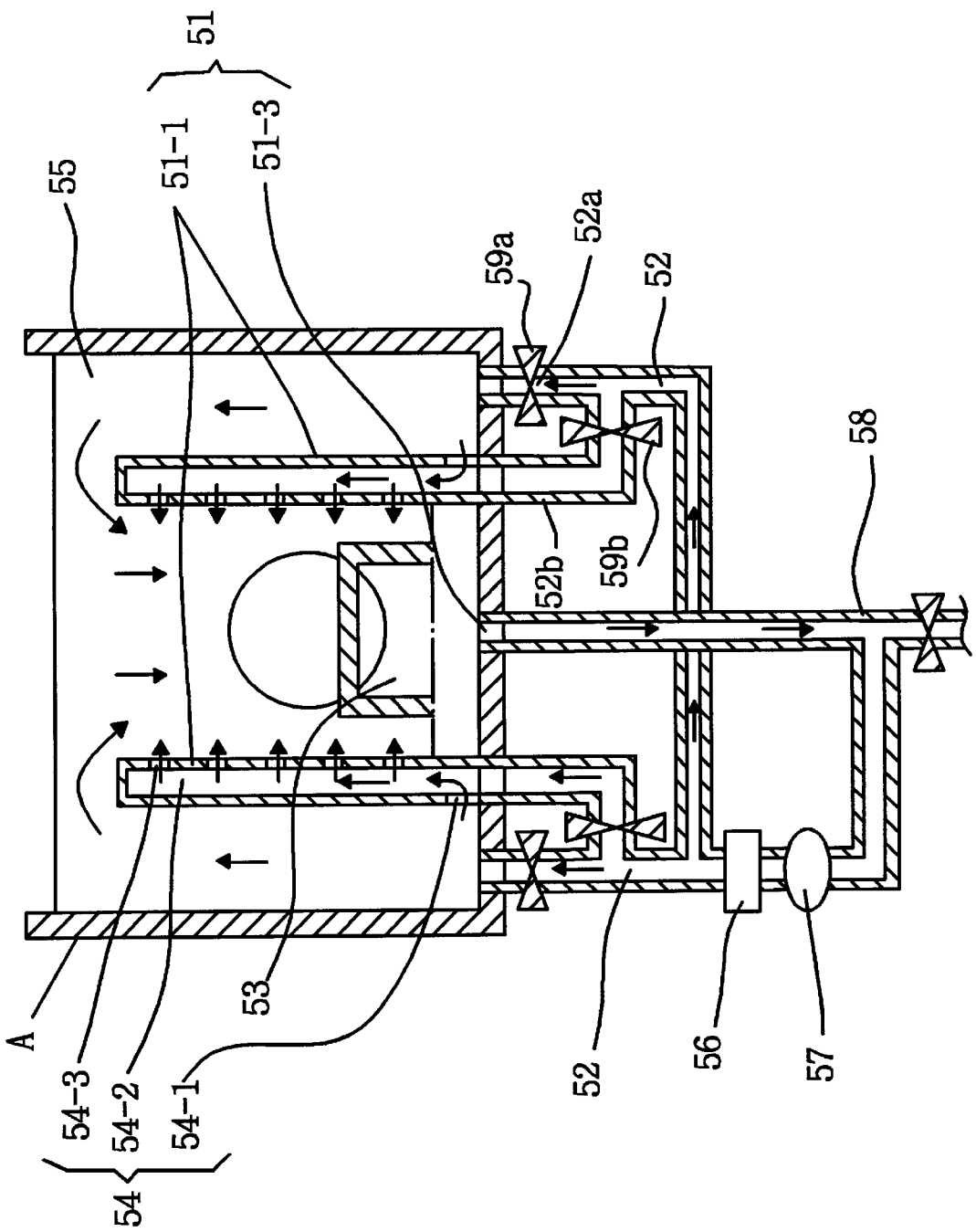
FIG. 5 is a schematic sectional view of another preferred embodiment of the semiconductor wafer wet processing device according to the present invention.

FIG. 5 is a schematic, cross-sectional view of another embodiment of the semiconductor wafer wet processing device according to the present invention.

This embodiment of the semiconductor wafer wet processing device of the present invention was developed so that an upper process solution supplier 55 and a lateral process solution supplier 54 can operate together or separately. That is, as shown in FIG. 5, the upper process solution supplier 55 and the lateral process solution supplier 54 are divided from a main supply line 52 of the original flow. The flow controllers 59a and 59b are provided to receive the flow from branch lines 52a and 52b, respectively. Thus, the upper process solution supplier 55 and the lateral process solution supplier 54 can be operated separately or in combination. That is, if necessary, the solution can be supplied only from the top of the wafer or only laterally therefrom, or can be simultaneously supplied to the top and the side of the wafer.

Figure 6:
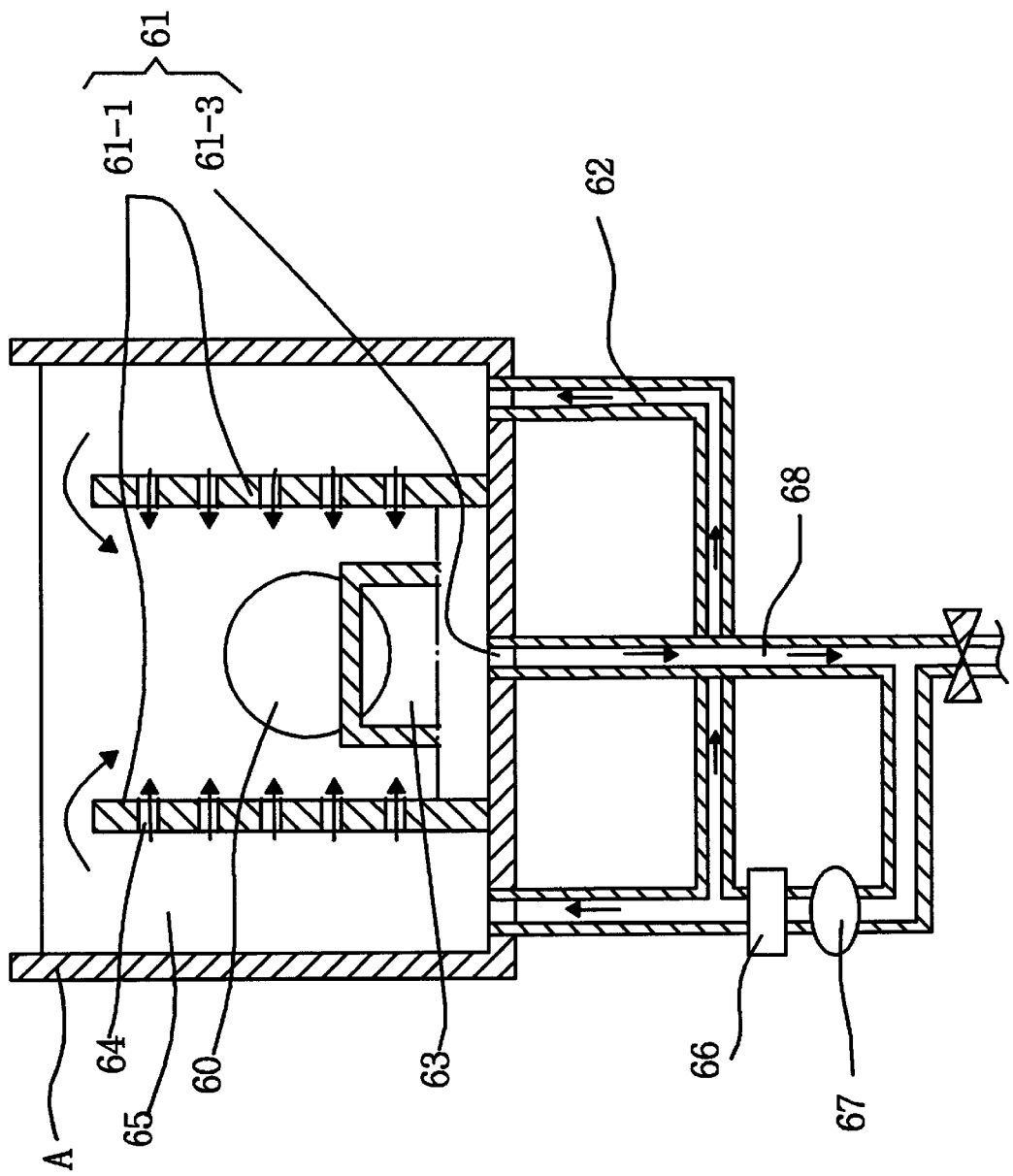
FIG. 6 is a schematic sectional view of still another embodiment of the semiconductor wafer wet processing device according to the present invention.

FIG. 6 is a schematic cross-sectional view of still another embodiment of the semiconductor wafer wet processing device according to the present invention. This embodiment of the semiconductor wafer wet processing device of the present invention defines distribution holes passing through the processing tank body wall 61-1, whereby the processing solution can laterally pass through the lateral process solution supplier 64 as shown in FIG. 6. This configuration is advantageous in its simplification.

The embodiments of FIGS. 4, 5, and 6 are similar in construction with the main differences being directed to the manner of distribution of the process solution. In these embodiments, walls 31-1 and 51-1 can be detached from the walls containing distribution holes 34-3 and 54-3 to create the embodiment of FIG. 6. All of the walls of the processing tank body can be removed for cleaning and other purposes. Furthermore, the distribution holes 54-3 and 64 are positioned to aim at the side portion of the wafer, as explained in the first embodiment of the present invention shown in FIG. 4, and the magnitude of the distribution holes is controlled according to the desired quantity of process solution or the flow velocity and the strength thereof. The peripheral portion of distribution holes is made of a material resistant to wear and friction.

In FIGS. 5 and 6, there are wafer-carrying buckets 53 and 63, a wafer 60, upper process solution suppliers 55, 65, filters 56 and 66, pumps 57 and 67, exhausting lines 58 and 68, and exhausting holes 51-3 and 61-3.

The semiconductor wafer wet processing device of the present invention has a constant-direction flow of the process solution, so that a good effect in removing contaminant material from the periphery and side of the wafer can be achieved. This is to be distinguished from conventional devices in which the cleaning or treating processing effect are not good for cleaning or treating the edge portion or the side portion of the wafer because these portions are not exposed to the effect of process flow. In addition, it is easy to remove particles which adhere to the wafer because the process solution flows in several directions.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A semiconductor wafer wet processing device comprising:

a chamber;

a process tank body having walls and disposed within said chamber, a channel being defined between said chamber and said walls, at least one of said walls of said process tank body containing a plurality of apertures for providing lateral access between said channel and an interior of said process tank body;

a wafer-carrying device disposed within said process tank body;

inlet means for introducing a processing liquid into said channel; and outlet means for removing the processing liquid from the interior of said process tank body, wherein upon introduction of the processing liquid through said inlet means into said channel, the processing liquid flows over a top of said walls of said process tank body into the interior thereof and through the plurality of apertures in said walls of said process tank body to provide lateral and vertical flow of the processing liquid over contents of said wafer-carrying device, the processing liquid flowing out through said outlet means.

2. The semiconductor wafer wet processing device of claim 1, wherein opposing walls of said process tank body contain the plurality of apertures.

3. The semiconductor wafer wet processing device of claim 1, wherein said at least one of said walls is a double wall comprising an inside portion which faces the interior of said process tank body and an outside portion which faces said channel, said inside and outside portions defining a wall chamber, said inside portion containing a plurality of apertures and said outside wall containing an access hole, wherein upon introduction of the processing liquid through said inlet means into said channel, the processing liquid flows over the top of said double wall of said process tank body into the interior thereof, flows through said access hole into said wall chamber to pass laterally through the plurality of apertures in said inside portion of said double wall for treating the contents of said wafer-carrying device and is removed through said outlet means.

4. The semiconductor wafer wet processing device of claim 2, wherein the opposing walls of said process tank body are double walls.

5. The semiconductor wafer wet processing device of claim 1, further comprising conduit means for recycling the processing liquid from said outlet means to said inlet means.

6. The semiconductor wafer wet processing device of claim 3, further comprising conduit means for recycling the processing liquid from said outlet means to said inlet means.

7. The semiconductor wafer wet processing device of claim 5, further comprising a pump and a filter operatively associated with said conduit means.

8. The semiconductor wafer wet processing device of claim 6, further comprising a pump and a filter operatively associated with said conduit means.

9. The semiconductor wafer wet processing device of claim 6, further comprising valve means operatively associated with said conduit means for selectively introducing the processing liquid to either the chamber or said wall channel.

10. The semiconductor wafer wet processing device of claim 3, wherein said outside portion of said double wall is detachable.

11. The semiconductor wafer wet processing device of claim 9, wherein opposing walls of said process tank body contain said plurality of apertures.

12. The semiconductor wafer wet processing device of claim 9, wherein said outside portion of said double wall is detachable.

13. A method for treating a semiconductor wafer disposed in a process tank body comprising:

introducing a processing liquid laterally to at least one side of the semiconductor wafer and to a top of the semiconductor wafer; and removing the processing liquid from the process tank body.

14. The method for treating a semiconductor wafer of claim 13, wherein the processing liquid is filtered and recycled for repeat use.

15. The method for treating a semiconductor wafer of claim 13, wherein the processing liquid is introduced laterally to both sides of the semiconductor wafer.

16. The method for treating a semiconductor wafer of claim 15, wherein the processing liquid is uniformly distributed to both sides of the semiconductor wafer.

17. A semiconductor wafer wet processing device comprising:

a process tank body having walls defining an interior tank body;

a plurality of apertures formed in the walls along the interior tank body;

a wafer-carrying device within the interior tank body of said process tank body; and a processing liquid supplier for providing flow of processing liquid over contents of said wafer-carrying device vertically from a top of the walls and laterally from said plurality of apertures.

18. The semiconductor wafer wet processing device of claim 17, further comprising a valve switch for selectively providing flow of the processing liquid over the contents of said wafer carrying device vertically from the top of the walls, laterally from said plurality of apertures, and simultaneously vertically from the top of the walls and laterally from said plurality of apertures.

19. The semiconductor wafer wet processing device of claim 17, wherein at least one of the walls of said process tank body is a double wall having an interior wall and an exterior wall with a wall chamber therebetween, said plurality of apertures being formed in the interior wall and a supply hole being formed in the exterior wall to enable flow of the processing liquid into said supply hole, through said double wall, out of said plurality of apertures and into the interior tank body.

20. The semiconductor water wet processing device of claim 17, further comprising:

a container for housing said process tank body, a channel being formed between the walls of said process tank body and walls of said container;

an inlet port formed through a bottom wall of said container for providing supply of the processing liquid; and an outlet port formed through a bottom wall of said process tank body for enabling flow of the processing liquid out of said process tank body.

* * * * *